(12) United States Patent
Chung et al.

(10) Patent No.: US 6,975,465 B1
(45) Date of Patent: Dec. 13, 2005

(54) METHOD AND APPARATUS FOR USE OF BEAM CONTROL PRISMS WITH DIODE LASER ARRAYS

(75) Inventors: Te-Yuan Chung, Orlando, FL (US); Michael Bass, Orlando, FL (US); Daniel P. Rini, Orlando, FL (US); H. Randolph Anderson, Clermont, FL (US); Louis Chow, Winter Park, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 32 days.

(21) Appl. No.: 10/407,523

(22) Filed: Apr. 3, 2003

Related U.S. Application Data

(60) Provisional application No. 60/369,781, filed on Apr. 3, 2002.

(51) Int. Cl.[7] .......................... G02B 5/04; G02B 27/14; H01S 3/08
(52) U.S. Cl. ...................... 359/831; 359/638; 372/100; 372/99
(58) Field of Search ............... 359/831–837, 359/618, 638, 640, 625, 566, 27; 372/32, 372/36, 50, 34, 100, 38.1, 102, 107, 38.01, 372/38.02

(56) References Cited

U.S. PATENT DOCUMENTS

| | | | |
|---|---|---|---|
| 4,719,635 A * | 1/1988 | Yeh ............................. 372/50 |
| 4,807,238 A | 2/1989 | Yokomori ..................... 372/32 |
| 5,001,719 A | 3/1991 | Trussell ........................ 372/50 |
| 5,012,477 A | 4/1991 | Mesquida et al. ............ 372/50 |
| 5,438,586 A * | 8/1995 | Ishii et al. ..................... 372/50 |
| 5,703,890 A * | 12/1997 | Thony et al. ................. 372/12 |
| 5,828,683 A * | 10/1998 | Freitas ......................... 372/36 |
| 6,088,377 A * | 7/2000 | Matsuda ....................... 372/50 |
| 6,115,401 A * | 9/2000 | Scobey et al. ............. 372/100 |
| 6,259,713 B1 | 7/2001 | Hwu et al. .................... 372/36 |
| 6,327,285 B1 | 12/2001 | Wang .......................... 372/36 |
| 6,587,287 B2 * | 7/2003 | Fukuda et al. .............. 359/833 |
| 2004/0047387 A1 * | 3/2004 | Bunting et al. ............... 372/70 |

\* cited by examiner

Primary Examiner—Georgia Epps
Assistant Examiner—M. Hasan
(74) Attorney, Agent, or Firm—Saliwanchik, Lloyd & Saliwanchik

(57) ABSTRACT

The subject invention relates to beam control prisms and the use of a beam control prism to modify the beam properties of light emitted from an edge emitting diode laser. The subject invention can utilize a beam control prism placed next to a diode laser bar. The subject beam control prism can have, for example, a curved surface and/or a high reflective coated surface for a diode laser wavelength. The curved surface can collimate the fast axis divergence and the mirror surface can change the beam direction. The subject curved surface beam control prisms can incorporate one or more features, such as parabolic reflecting surface, elliptical exit surface with flat reflecting surface, and a hyperbolic entrance surface with flat reflecting surface.

76 Claims, 14 Drawing Sheets

$n(x, c) := 1.5 + c \cdot x^2$

METHOD AND APPARATUS FOR USE OF BEAM CONTROL PRISMS WITH DIODE LASER ARRAYS

CROSS-REFERENCE TO A RELATED APPLICATION

This application claims priority from provisional patent application U.S. Ser. No. 60/369,781, filed Apr. 3, 2002.

BACKGROUND OF INVENTION

Keeping diode lasers cool is a major concern for most diode laser applications. For high power diode laser arrays, thermal management is a critical concern. Modern diode laser array designs can generate a heat flux greater than 400 W/cm$^2$. The traditional way for packaging an edge emitting diode array is by stacking the diode lasers vertically with cooling and electrical connection plates sandwiched in between. The diode active area, which generates tremendous amount of waste heat, is a considerable distance from the coolant in the traditional design. Also, several layers of solder and an electrical insulation layer must be used resulting in additional thermal resistance. This design results in a longer cooling path than is desirable in order to maintain uniform cooling for all diodes. The longer cooling path results in higher diode temperature, lower efficiency, shorter diode life, slower thermal response and non-optimum temperature control. In addition, it is difficult to replace malfunctioning bars in this type of stack.

High divergence and astigmatism are two additional problems associated with diode laser output beams. Microlens arrays are often utilized for correcting the divergence. There are several ways to collimate the beam. For example, two sets of cylindrical lens arrays, planar micro lens arrays, and diffractive optics are often used. However, complexity, aberration and/or diffraction efficiency are concerns that arise from using these types of features.

BRIEF SUMMARY OF THE INVENTION

The subject invention relates to beam control prisms and the use of a beam control prism to modify the beam properties of light emitted from an edge emitting diode laser. The subject invention can utilize a beam control prism placed next to a diode laser bar. The subject beam control prism can have, for example, a curved surface and/or a high reflective coated surface for a diode laser wavelength. The curved surface can collimate the fast axis divergence and the mirror surface can change the beam direction. Using such a prism instead of a mirror can reduce the physical length of the diode plus beam control device, thus increasing the density of diode bars that can be placed in any given area. The larger the refractive index of the prism material, the shorter the physical length. The subject curved surface beam control prisms can incorporate one or more features, such as parabolic reflecting surface, elliptical exit surface with flat reflecting surface, and a hyperbolic entrance surface with flat reflecting surface. These surface features can provide substantially aberration free surfaces for beam control purposes. By extending these curves in one direction, beam control prisms can be used with an entire bar of diodes. If the curved surfaces are made circular then there will typically be some spherical aberration. However, a cylindrical exit surface feature results in the smallest amount of spherical aberration and can be quite useful. In a specific embodiment, a diffraction grating on the exit surface can be utilized to control the laser diode slow beam divergence.

The beam properties which can be modified by the subject prisms include, for example, direction and angular divergence. The subject prisms change the direction of the beam. In a specific embodiment, the subject prism can direct the beam to be perpendicular to the plane of the laser diode emitter. The subject invention can enable diodes to be surface mounted. Surface mounting of the laser diode bars can enable the diodes to remain much closer to the coolant, reducing the diode temperature and providing a shorter thermal response time. The subject prisms can also correct divergence and astigmatism problems. Surface mounting can provide for superior thermal management as well as a simplified method of assembling laser diode arrays. The subject invention also relates to a method to electrically connect the diode bars in series. The subject invention can also provide for a means to replace and repair faulty bars of diodes.

The index of refraction of the subject prism can enable one to reduce the physical length of the beam turning and divergence controlling optic, as compared with the use of mirrors. This can allow for a shorter repeat distance between diodes and, hence, a higher packing density. Also, properly cutting and polishing sections of cylindrical rods of glass, fused quartz, and other materials can produce beam control prisms.

The present invention can be applied to any diode laser array. For example, the subject invention can allow use of a surface mount instead of a stack mount design. The subject invention can reduce the cooling path and provide uniform cooling across the active area of emitters. The subject invention can utilize beam control prisms to address the high divergence of the diode light and to turn the light away from the mounting surface. The subject prism design can also provide the freedom to control the spot size and direction of laser beam.

DETAILED DESCRIPTION OF THE INVENTION

The subject invention relates to the use of a beam control prism for redirecting, and/or modifying the beam characteristics of, one or more sources of light. Such sources of light can include, for example, laser diodes, laser diode arrays, and/or diode bars. In a specific embodiment, the source of light can emanate from a diode bar mounted on a substrate.

Figure 1A:
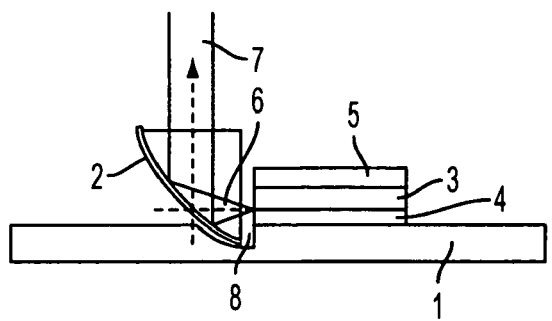
FIG. 1A shows a cross section of a laser diode device in accordance with the subject invention incorporating a laser diode bar, with electrodes, positioned on a substrate and a beam control prism positioned within a groove in the substrate.

The use of a prism with a reflective surface can enable the mounting of an edge emitting laser diode on a flat surface. Surface mounted construction can be simpler and can provide for better thermal management of the diodes, compared to conventional stack mounting technology. A specific embodiment of the subject invention is shown in FIG. 1A. This embodiment incorporates a reflective prism 2 mounted on an electrically insulated, thermally conductive substrate 1 next to an edge emitting laser diode 3. An electrical conductor 4 is applied on top of the substrate 1 to provide one of the electrical connections to the diode 3. Another conductor 5 is attached to the top of the diode 3 to provide the other electrical connection. When electrical power is applied to electrical connections 4 and 5, the laser diode 3 emits a beam 6. The prism 2 corrects divergence of the beam and turns the light direction away from the diode plane. In the specific embodiment shown in Figure A, the resulting beam is perpendicular to the diode plane. Other angles can also be accomplished. The resulting beam 7 exits away from the surface of the prism.

Figure 1B:
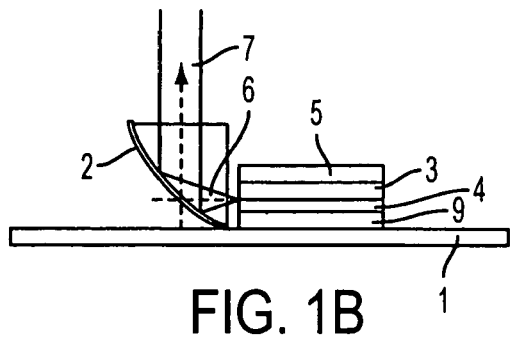
FIG. 1B shows a cross section of a laser diode device in accordance with the subject invention incorporating a laser diode bar, with electrodes, positioned on a spacer, which is positioned on a substrate and a beam control prism positioned above the upper surface of the substrate.

Although the embodiment shown in FIG. 1A shows the laser diode bar positioned substantially parallel, alternative embodiments can involved the positioning of the laser diode bars of an angle with respect to the upper surface of the substrate. This angle can be a few degrees, or up to 90°. FIG. 1B shows an embodiment of the subject invention with the laser diode bar, with electrodes, positioned on a spacer 9 where the spacer 9 is on the upper surface of the substrate. The use of spacer 9 can allow the positioning of the subject beam control prism without a groove in the substrate. The spacer can also allow positioning of the laser diode bar at an angle with respect to the upper surface of the substrate. In another specific embodiment (not shown), the laser diode can be positioned below the upper surface of the substrate, by, for example, positioning the laser diode bar in a groove in the substrate.

In specific embodiments, the subject invention can incorporate a conducting substrate. The subject invention can utilize a substrate material with low thermal resistance and an ability to be patterned with electrodes. Thermal resistance is proportional to the heat flow path length such that a thinner substrate can provide lower thermal resistance. In a specific embodiment, a substrate with thickness of less than about 2 mm can be used. In a further embodiment, a substrate with thickness of less than about 1 mm can be used. The substrate can be either an electrical conductor or insulator. In a specific embodiment, utilizing a substrate which is an insulating material, an electrode can be bonded directly on top of the insulator substrate. BeO is a typical insulator substrate material that could be used for diode packaging. Other materials can also be utilized. A layer of copper can be bonded on top of BeO to form the electrode pattern.

The use of an electrically conductive substrate can involve applying a layer of insulator, such as GaAs, before applying the electrodes. For example, a copper substrate can be used with a layer of an insulating material, such as GaAs or diamond, on the substrate onto which to put an electrode on. If a layer of insulator is not applied, all the bars can have a common p-side.

Figure 2:
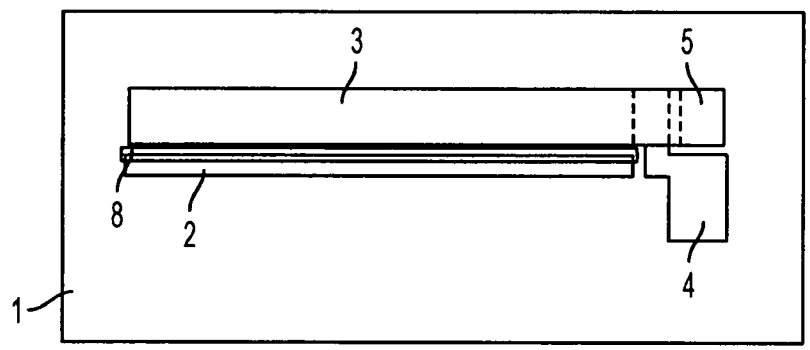
FIG. 2 shows a top view of the embodiment of the subject invention shown in FIG. 1A.
Figure 3:
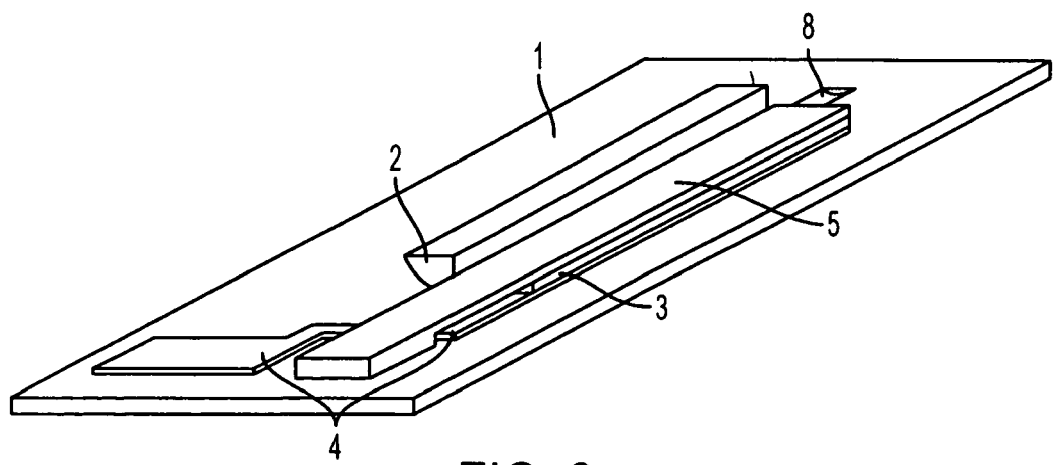
FIG. 3 shows a perspective view of the embodiment of the subject invention shown in FIG. 1A.
Figure 4:
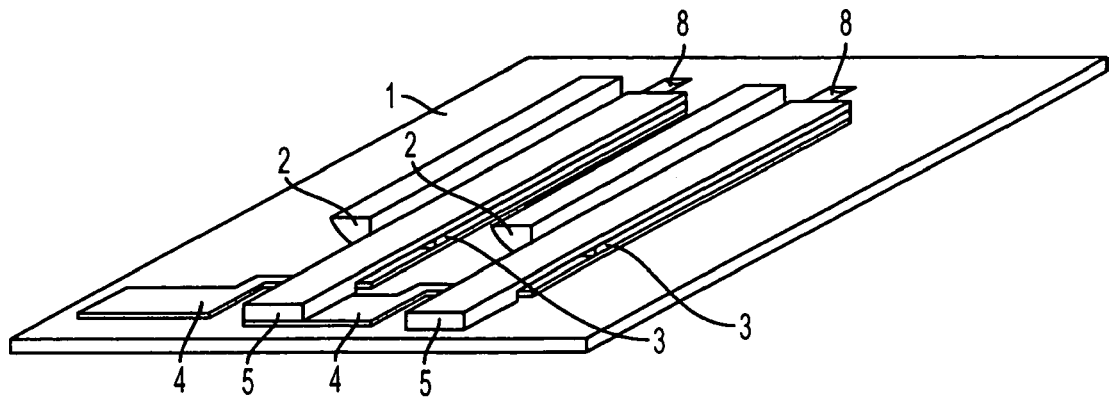
FIG. 4 shows a perspective view of two laser diode bars in accordance with the subject invention electronically connected in a vertically series connection.

A top view and an isometric drawing of the embodiment of the subject invention of FIG. 1 are presented in FIGS. 2 and 3, respectively. The electrical connections 4 and 5 can extend beyond the length of the diode 3. The shape of electrical connection 4 can be designed so as to allow electrical connection to an adjacent diode. Electrical connection 4 can extend under the entire length of the diode 3 and then extend slightly further before turning towards an adjacent diode. The electrical connection 4 can then terminate in a rectangular area inline with an adjacent diode. Laser diodes have a very low electrical resistance; therefore wiring them in series can simplify the power management of a large number of diodes. The electrical connection 5 can extend beyond the diode 3 to make direct electrical connection to the electrical connection 4 of an adjacent diode. FIG. 4 shows an assembled view of two laser diode bars. This type of series connection of adjacent laser diode bars can be referred to as vertical series connected. The electrical connection 5 from the diode on the left side is connected to electrical connection 4 from the diode on the right thus wiring consecutive diode bars in series. Although FIG. 4 shows two diodes, it is expected that hundreds, or even thousands, of diodes can be mounted and wired in this arrangement.

Electrical connection 4 can be applied directly onto the substrate 1 surface similar to the electrical connections found on conventional circuit boards. Such techniques include, for example, metallization of the substrate with a mask in place. A groove 8 can then be etched or cut into the substrate 1 surface to provide placement and support for the beam control prism.

Typical laser diode bars incorporate many laser diodes. These bars are typically about 1 cm long, 1 mm wide, and 100 mm thick. The light is produced and emitted about 2 mm up from one of the surfaces defining the thickness of the bar and parallel with the diode laser plane. As the material the laser diodes are produced on is often not a good thermal conductor, the diode laser bar is typically positioned such that the surface which is closest to the laser diodes, and parallel to the laser diode plane, is closest to substrate 1 so that heat generated in the laser diodes can be removed through substrate 1, so that heat generated in the laser diodes can be removed through the substrate 1. For this reason, the bottom portion of the prism can be positioned lower than the bottom surface of the laser diode bar so that the beam 6 emitted from the laser diode can enter the prism and be reflected by the prism's reflecting surface to exit from the prism. Preferably, the prism is positioned relative to the laser diode bar so that at least 50% of the beam's power enters the beam control prism, more preferably at least 70% of the beam's power enters the beam control prism, and more preferably at least 90% of the beam's power enters the beam control prism.

The embodiment shown in FIG. 1 involves positioning an electrical connection 4 on the upper surface of the substrate 1, positioning the diode laser bar 3 on top of the electrode, and positioning the prism 2 such that at least a portion of the prism 2 is below the upper surface of substrate 1. The placement of prism 2 such that at least a portion of the prism is below the upper surface of substrate 1 allows the prism to receive the lower portion of the beam 6, emitted from laser diode bar 3, which is directed downward upon being emitted from laser diode bar 3, such that the lower portion of the beam will be reflected by the curved surface of the prism 2. In an alternative embodiment, a spacer may be placed on the upper surface between the upper surface of the substrate 1 and the electrical connection 4 and the prism 2 positioned such that the entire prism 2 is located above the upper surface of the substrate 1, so that the prism still receives the lower portion of beam 6 such that the lower portion of the beam 6 is still reflected by the curved surface of prism 2.

In another alternative embodiment, groove 8 can be expanded (or an additional groove created) such that a portion of, or all of, the electrical connection 4 is positioned below the upper surface of substrate 1. This expanded groove 8 can also allow a portion of, or all of, the laser diode bar to be positioned below the upper surface of substrate 1. In these embodiments, the prism 2 can be lowered a corresponding amount such that prism 2 properly receives beam 6 as discussed above. Positioning the laser diode bar 3 on an electrical connection 4 which is positioned on the upper surface of substrate 1, or on the exposed surface of a groove into the top of the substrate, can allow access to the laser diode bar from the top of the device. Such access from above the device can make it easier to access the laser diode bars when, for example, one needs to replace a laser diode bar. Also, such access from above the device can enable the subject devices to be assembled robotically.

The subject invention also relates to apparatus having a laser diode bar embedded into the side of a groove in a substrate. An example of such a device is taught in U.S. Pat. No. 6,259,713, which is hereby incorporated by reference in its entirety to the extent it is not inconsistent with the teaching of the subject application. Various other features of the subject invention can then be utilized with this embodiment.

Figure 5:
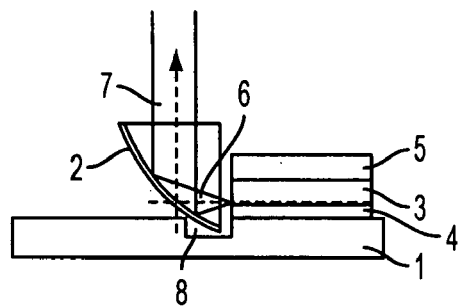
FIG. 5 shows an embodiment of the subject invention incorporating a beam control prism having a flat entrance surface, a curved reflective surface, and a flat exit surface.
Figure 6:
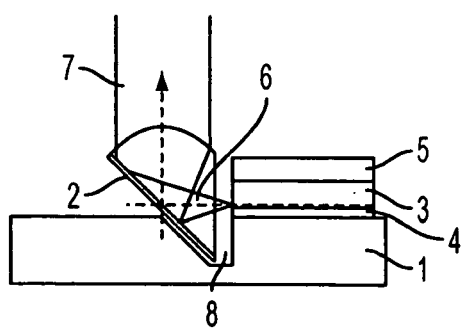
FIG. 6 shows an embodiment of the subject invention incorporating a beam control prism having a flat entrance surface, a flat reflecting surface, and a curved exit surface.
Figure 7:
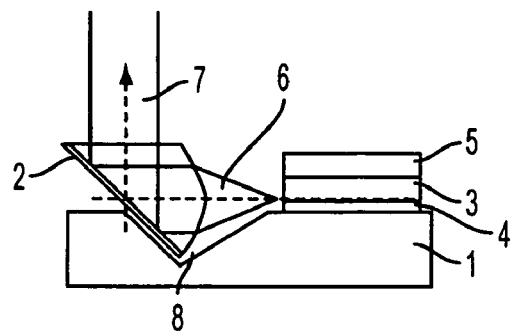
FIG. 7 shows an embodiment of the subject invention incorporating a beam control prism having a curved entrance surface, a flat reflecting surface, and a flat exit surface.
Figure 8:
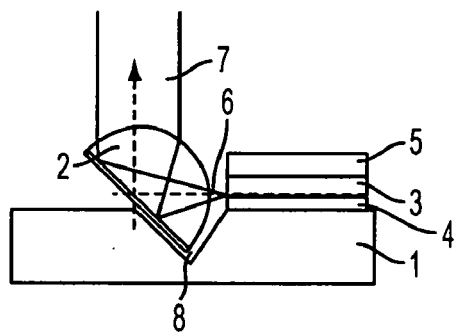
FIG. 8 shows an embodiment of the subject invention incorporating a beam control prism having a curved entrance surface, a flat reflecting surface, and a curved exit surface.

In a specific embodiment, the subject beam control prism can have an entrance surface through which the beam from the laser diode enters the beam control prism, a reflecting surface which reflects the beam which enters the entrance surface, and an exit surface through which the reflected beam exits the beam control prism. Each of these surfaces can be flat or curved. Utilizing at least one curved surface can allow control of fast axis divergence. Other features can be incorporated with a flat surface, or curved surface, to control fast axis divergence as well. These feature include, but are not limited to, micro fresnel lens, diffractive optics, and/or diffractive gratings. Many combinations of flat and curved surfaces, and these additional features, can be utilized for control of fast axis divergence. These additional features can also allow for control of slow axis divergence. FIGS. 5–8 show four specific embodiments of beam control prisms in accordance with the subject invention. FIG. 5 shows a prism having a flat entrance surface, a curved reflecting surface, and a flat exit surface. FIG. 6 shows a prism having a flat entrance surface, a flat reflecting surface, and a curved exit surface. FIG. 7 shows a prism having a curved entrance surface, a flat reflecting surface, and a flat exit surface. FIG. 8 shows a prism having a curved entrance surface, a flat reflecting surface, and a curved exit surface (similar to a folded ball lens). The prism shown in FIG. 5 uses a curved surface to both reflect light and correct fast axis divergence at the same surface, where the fast axis divergence relates to the spread of the beam 6 in a plane perpendicular to the plane of the laser diode emitter. The prisms shown in FIGS. 6–8 use a 45° flat reflecting surface to turn the light and separate curved surface(s) to correct the fast axis divergence of the light coming from diode laser emitters.

The reflective surface of prisms 2 shown in FIGS. 5, 6, and 8 can be coated with a dielectric or metallic high reflectivity coating. The prism shown in FIG. 7, having the curved entrance, can rely on total internal reflection at the flat surface, and/or can incorporate a high reflectivity coating. The prism shown in FIG. 8 can achieve total internal reflection, depending on the index of refraction of the prism and beam divergence angle of the fast axis. An embodiment of the subject prism utilizing a material having a high refractive index, and/or utilized in conjunction with a laser diode emitter having a smaller divergence angle beam, can allow use of total internal reflection instead of coatings. The use of materials with high index of refraction for the subject prisms can result in higher numerical aperture prisms and more effective control of the angular spread, with fewer losses. The subject invention also relates to the application of diffractive optics and/or other micro-lenses with the beam control prism surfaces to also correct slow axis divergence of the light coming from the diode laser emitters, where the slow axis divergence relates to the spread of the beam 6 in the plane of the laser diode emitter. By so doing, both fast and slow axes divergence can be controlled.

Figure 9:
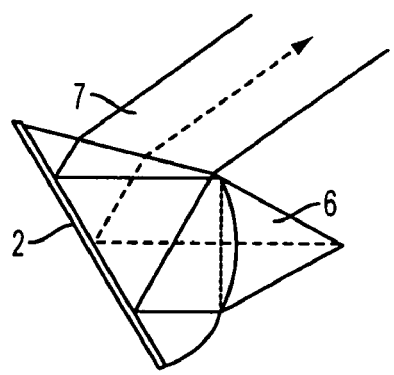
FIG. 9 shows a beam control prism in accordance with the subject invention tilted such that the angle between the exiting beam and incoming beam is less than 90 degrees.
Figure 10:
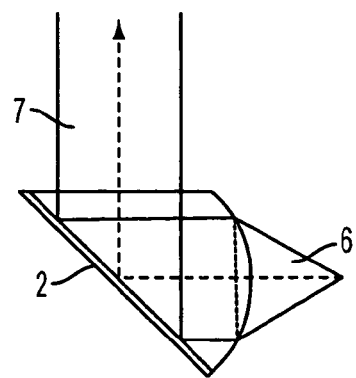
FIG. 10 shows a beam control prism in accordance with the subject invention positioned such that the exiting beam is perpendicular to the incoming beam.
Figure 11:
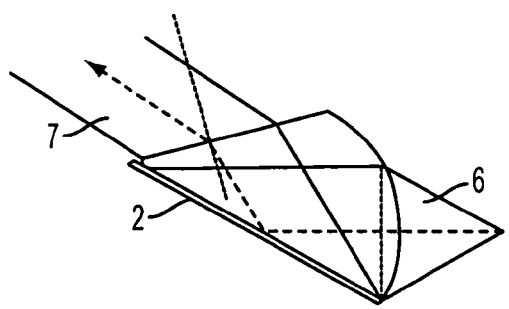
FIG. 11 shows a beam control prism in accordance with the subject invention tilted such that the angle between the exiting beam and incoming beam is greater than 90 degrees.
Figure 12:
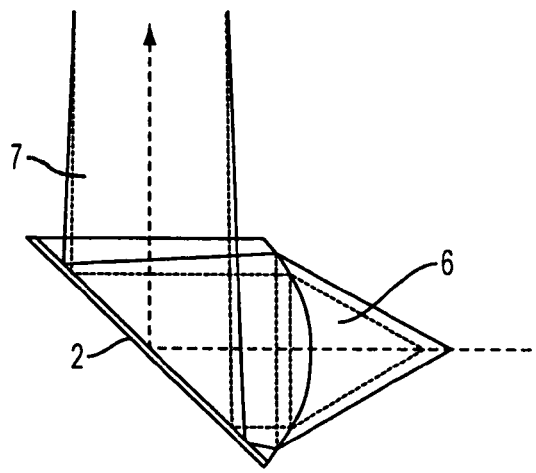
FIG. 12 shows how movement of a beam control prism in accordance with the subject invention can impact the exiting beam.
Figure 13:
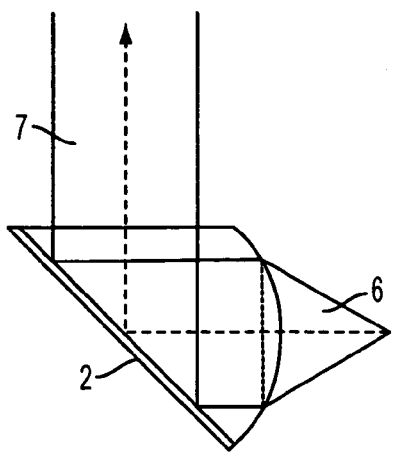
FIG. 13 shows an embodiment of the beam control prism in accordance with the subject invention in a certain relative position with respect to an incoming beam.
Figure 14:
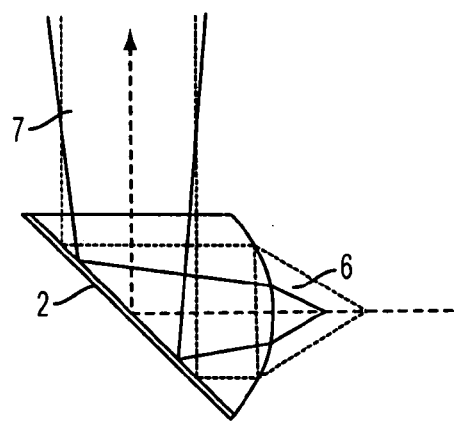
FIG. 14 shows how movement of a beam control prism in accordance with the subject invention can impact the exiting beam.
Figure 15:
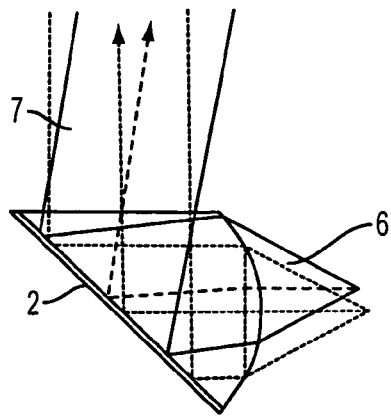
FIG. 15 shows how rotation of a beam control prism in accordance with the subject invention can impact the exiting beam.

The subject invention also pertains to the movement and/or rotation of the subject prisms to alter various characteristics of the beam exiting the prism. If the subject prism is tilted, the beam direction can be altered as shown in FIG. 9, FIG. 10, and FIG. 11. If the subject prism is moved as shown in FIG. 12, FIG. 13, FIG. 14, and FIG. 15, the focus, spot size, and/or beam direction can be adjusted. These characteristics give great flexibility for us to control the beam properties.

Using higher index of refraction material can give a wider angular tuning range. The reflective surface can set at an angle other than 45° to the direction of the diode output beam axis. In a specific embodiment, the reflective surface is set at an angle between about 30° and about 60°. This allows us to change the angular tuning range and/or the range of directions into which the laser beam can be sent.

Figure 16:
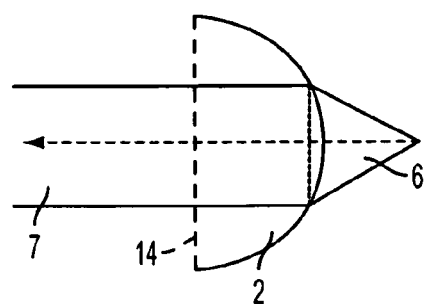
FIG. 16 shows a beam control prism in accordance with the subject invention having an anti reflection coating.
Figure 17:
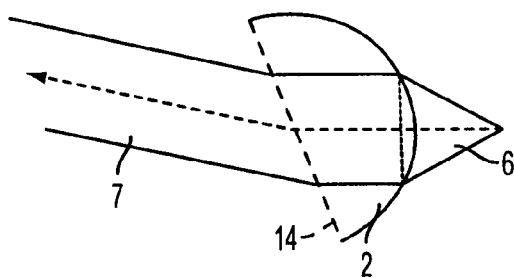
FIG. 17 shows the beam control prism shown in FIG. 16 rotated to a new position.
Figure 18:
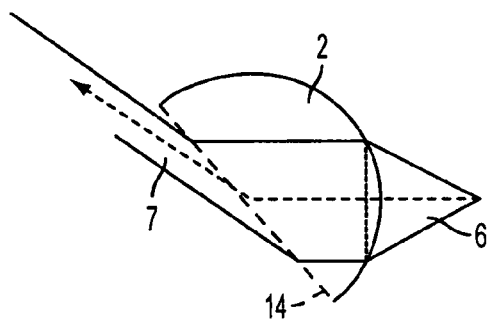
FIG. 18 shows the beam control prism shown in FIG. 16 rotated to a new position.
Figure 19:
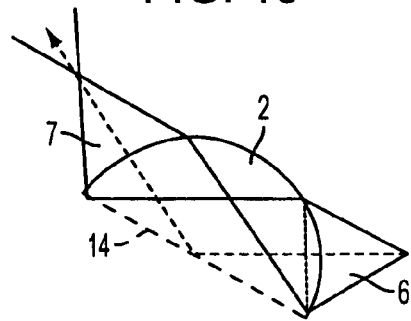
FIG. 19 shows the beam control prism shown in FIG. 16 rotated such that the beam is reflected by total internal reflection.

If a desirable beam direction is not very far from the original beam direction, we can apply an anti-reflection coating to the inclined surface 14 as shown in FIG. 16, FIG. 17, and FIG. 18. The prism can then work like an ordinary prism with a collimating lens. This design also has the capability to adjust the focus, spot size, and/or beam direction by shifting and/or tilting the prism. However, if the angle is larger than the internal reflection condition, all the light will be reflected instead of refracted from the flat surface, as shown in FIG. 19. This type of beam control prism can be utilized with traditional stacked bar packages to control the beam properties of these arrays of diode laser bars. For example, the light from each of the several bars in the stack can be focused and directed into a specific area such as in the pump light entrance surface of a solid state gain medium to be pumped by the diode bar stack.

Typical optical glasses can be utilized to produce prisms in accordance with the subject invention. In order to achieve high NA (numerical aperture) with respect to certain prism designs, higher index of refraction glasses can be used. Optical plastic can also be utilized to produce the subject prisms. Preferably, low absorption material is used. The use of low absorption material can minimize heating of the prism by the laser light, and reduce the risk of degrading the alignment of, or even melting, the prism.

In a specific embodiment, the subject prism can incorporate a dielectric coating. In certain applications, the subject beam control prism can handle high power lasers, such that any absorption in a coating can heat up the prism when in use. In a specific embodiment, dielectric coatings are preferred, such as in embodiments utilizing high power lasers. In addition, the entrance and/or exit surfaces of the subject prism can be coated with anti-reflection (AR) coatings. In a specific embodiment, the reflective surface can be coated with a high reflection (HR) coating. Depending on the particular beam control prism design and the application, the characteristics of the coating utilized can be modified. The specific coating design can also depend on the polarization of the incident light.

Beam control prisms which incorporate a circular curvature with respect to the surface onto which incoming optical power is incident typically suffer aberration. In applications in which each emitter is a coherent source, interference fringes can form when aberrations are involved. Aberrations are not desirable in most applications, although some applications are relatively insensitive to their presence. In a specific embodiment, the subject beam control prism can have a relatively high numerical aperture (NA) optic. Devices with a high NA tend to show a greater degree of aberration than devices with a low NA. The subject prism can incorporate one or more features to reduce, or substantially eliminate, aberrations. Examples of such features include conic surfaces, diffractive optics, and/or gradient index of refraction (GRIN) material.

Figure 20:
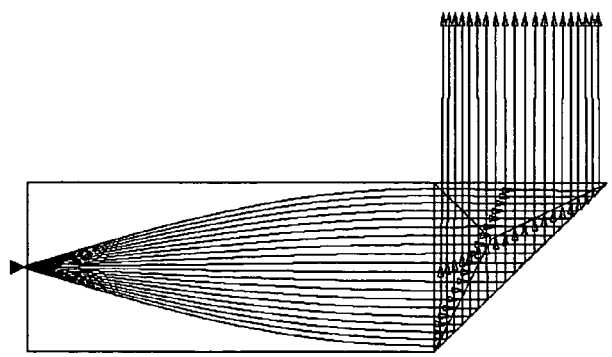
FIG. 20 shows an embodiment of the subject invention comprising a GRIN cylindrical lens and a 45°-90°-45° prism.

The use of a conic surface with the subject prism can enable reduced aberration, or aberration free prisms in accordance with the subject invention. FIG. 20 shows an embodiment of GRIN cylindrical lens with a 45°-90°-45° prism in accordance with the subject invention. In a specific embodiment, an elliptical surface can be utilized with a prism having a curved exit surface. In another specific embodiment, a hyperbolic surface can be utilized with a prism having a curved entrance surface. In another specific embodiment, a parabolic surface can be utilized with a prism having a curved reflective surface. Substantially aberration-free diffractive optics can be achieved with Fresnel lens versions of these conic surfaces.

The subject invention can accomplish these conic surfaces by, for example, special polishing and/or prism shaping techniques. In a specific embodiment, optical plastics can be, for example, molded, drawn, or extended to achieve the desired conic surfaces. In a specific embodiment utilizing optical glasses, these conic surfaces can be achieved by making use of techniques used for pulling optical fiber. In a specific embodiment, pulling optical glass through a conic shaped hole can form the desired shape.

The subject invention can also involve a beam control prism based on GRIN cylindrical lenses designed for use in a diode laser arrays. FIG. 20 shows the combination of a GRIN cylindrical lens and a 45°-90°-45° prism. The GRIN cylindrical lens can collimate the light and the prism can redirect the beam. This type of beam control prism can have a longer working distance than others. An additional piece of prism can be optically contacted to the GRIN lens. The longer working distance and additional piece of prism can make the size of this prism larger than other designs. In alternative embodiment prism between an approximately 30°-90°-60° prism and an approximately 60°-90°-30° prism can be utilized. The use of these prisms can allow the beam to be directed at a variety of angles.

Figure 21A:
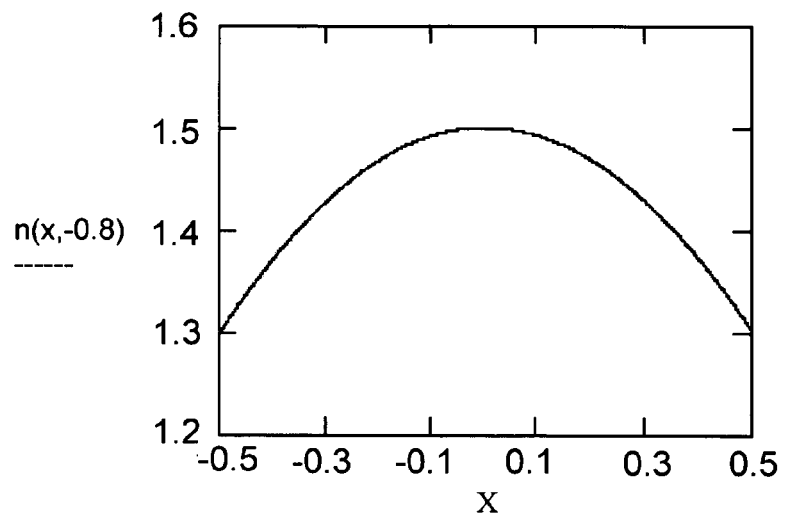
FIG. 21A shows the index profile of an embodiment of a sol-gel GRIN ball lens in accordance with the subject invention.
Figure 21B:
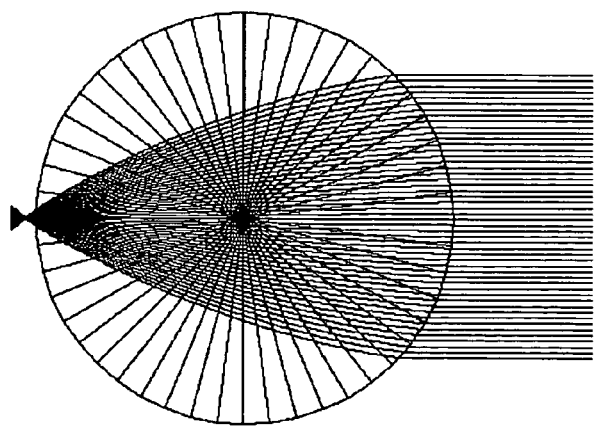
FIG. 21B shows a ray tracing of the sol-gel GRIN ball lens of FIG. 21A.

A specific embodiment of the subject invention involving a folded-ball beam control prism can have large spherical aberration. With respect to the subject folded-ball prism, marginal rays can have a shorter focal length and the chief ray can have a longer focal length. Therefore, by reducing the outer layer index of refraction, the focal length due to this region can be reduced. In a specific embodiment, an index distribution can be utilized which provides a virtually aberration-free collimation lens. FIG. 21A shows the index profile of an embodiment of a sol-gel GRIN ball lens in accordance with the subject invention. FIG. 21B shows a ray tracing of the sol-gel GRIN ball lens of FIG. 21A. The outer layer index is preferably around 1.3 with a ball having a maximum index of refraction of about 1.5. Sol-Gel materials can have an index of refraction as low as 1.2, allowing the outer layer to reach 1.3. The subject GRIN ball lens can be utilized as a beam control prism, as well as used in other high NA applications.

Figure 22A:
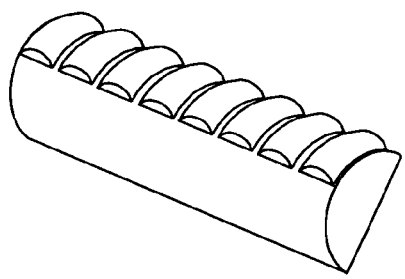
FIG. 22A shows an embodiment of a beam control prism in accordance with the subject invention comprising micro cylindrical lenses.
Figure 22B:
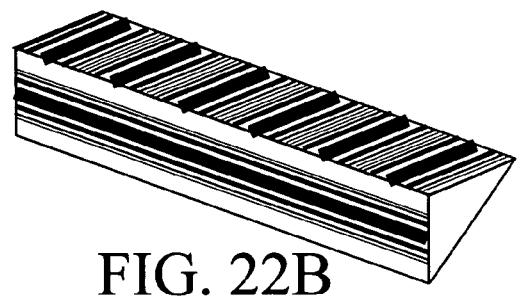
FIG. 22B shows an embodiment of a beam control prism in accordance with the subject invention comprising diffractive optics.
Figure 22C:
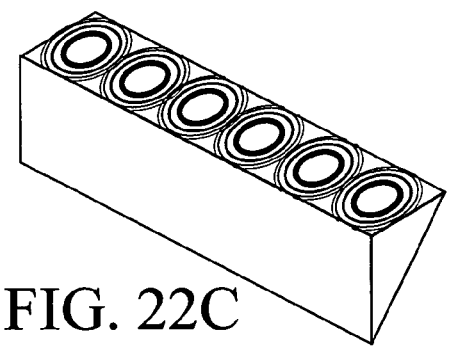
FIG. 22C shows an embodiment of a beam control prism in accordance with the subject invention comprising micro astimatic lens array.

Micro optics and diffractive optics are widely used for diode lasers. There are many different ways to incorporate micro optics and diffractive optics with the subject beam control prisms. FIGS. 22A–22C shows three examples of incorporation of micro optics/diffractive optics with the subject beam control prisms. The subject invention can incorporate micro Fresnel lens to control slow axis divergence. FIG. 22A shows an embodiment having micro cylindrical lenses formed by re-flow on top of a folded-ball beam control prism. These micro cylindrical lenses can correct for slow axis divergence. FIG. 22B shows an embodiment of the subject micro cylindrical invention which employs diffractive optics to correct both slow and fast axis divergence. The diffractive optics work as a curved entrance surface prism to control the fast axis spread of the diode laser light, while the top surface with a cylindrical lens array controls the slow axis spread. FIG. 22C shows an embodiment incorporating a micro astigmatic lens array etched on top of the prism to correct for both slow and fast axes of divergence of the light from the diode laser emitters. This embodiment is quite practical from a fabrication point of view.

The subject invention can utilize micro optics and/or diffractive optics to correct the slow axis divergence of the light from the diode laser emitters. There are several major benefits of diffractive optics. Diffractive optics can reduce, or eliminate, aberrations when the proper diffractive optics pattern is applied. The focal length with respect to diffraction optics can be determined by the photo mask patterns, and does not depend too strongly on index of refraction. However, using diffractive optics can increase the cost and complication of the fabrication of the subject prisms.

Figure 23:
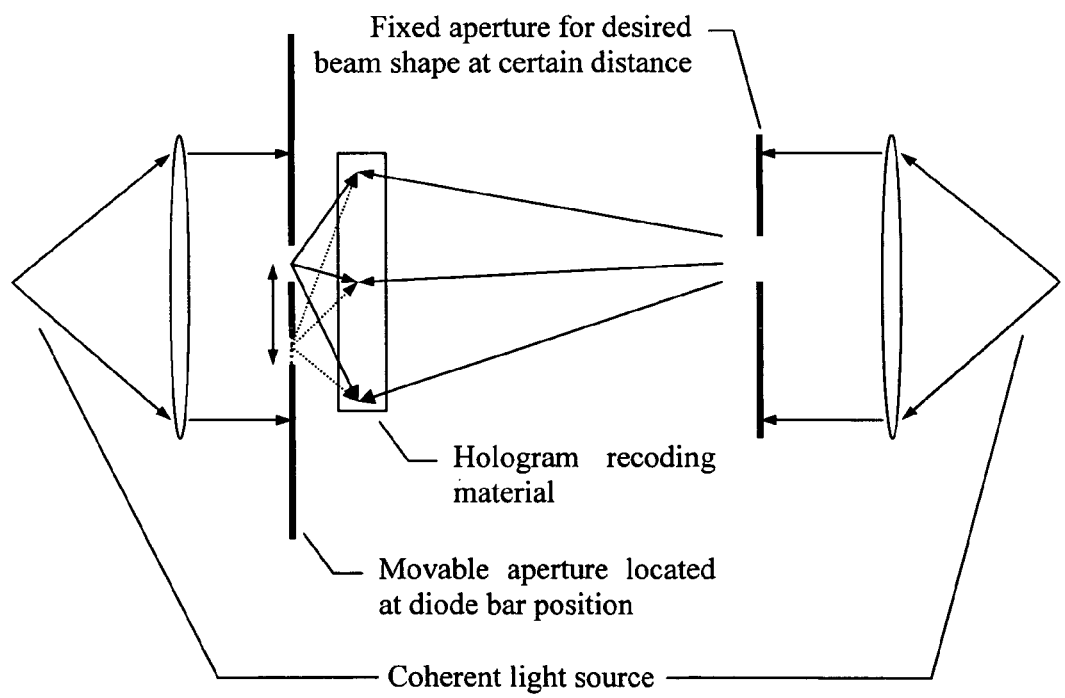
FIG. 23 shows a hologram recording procedure in accordance with the subject invention.

A laser diode bar with very dense emitters can be regarded as an incoherent finite line source. The use of simple geometric optics to focus the output light typically results in the loss of a considerable amount of power. The subject invention can utilize a thick or volume hologram as a way to focus the output light, while trying to reduce the loss of power. Theoretically, a thick hologram can be made by recording the hologram with two beams. A specific embodiment of a hologram recording procedure in accordance with the subject invention is shown in FIG. 23. Referring to FIG. 23, a light source with a long coherence length and exactly the same wavelength as the diode laser with which it is going to be used is split into two beams. One beam illuminates a movable aperture and the other beam illuminates a fixed aperture. The movable aperture can be a rectangular hole which represents a diode laser emitter and the fixed aperture can represent the desired image. The hologram recording material can be placed very close to the moving aperture. The moving aperture can then be exposed at each emitter's position. When both apertures are illuminated by coherent light, the light will interfere and the pattern will be recorded at the hologram material. Since laser diode emitters are mutually incoherent, the movable aperture can be illuminated at each emitter position.

After developing, this thick hologram can be placed in front of the laser diode bar such that each laser diode is in the same position as was held by the movable aperture. The laser diode emitter beams can then be diffracted into the position and shape of the fixed aperture in the recording procedure. During use, this thick hologram should be placed in the same position and orientation as used to make it, within an appropriate range of tolerance. The diffraction efficiency and other parameters can be determined for each case.

Figure 24:
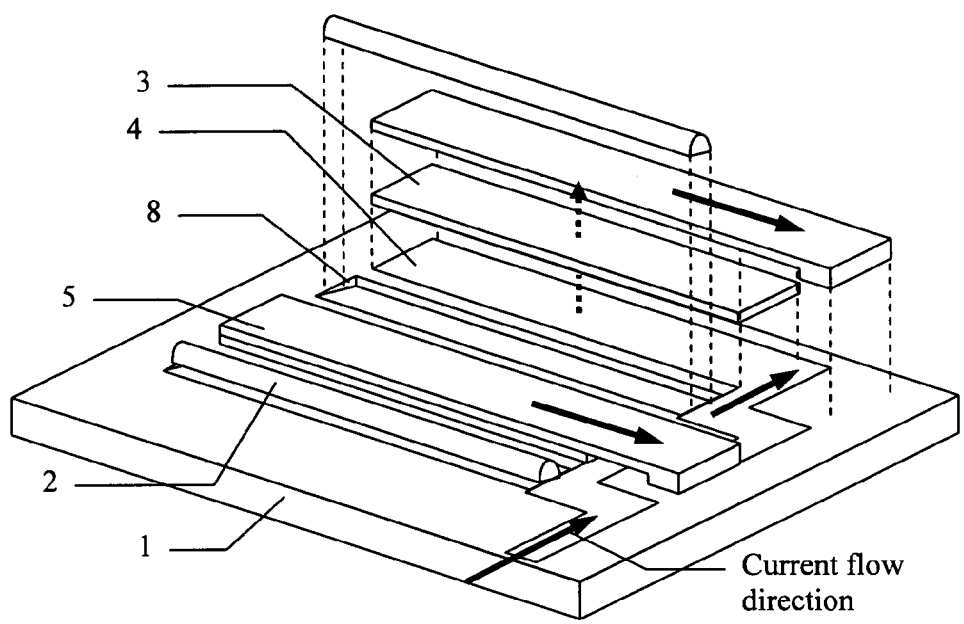
FIG. 24 shows a pair of laser diode bars in a vertically series connection in accordance with the subject invention.
Figure 25:
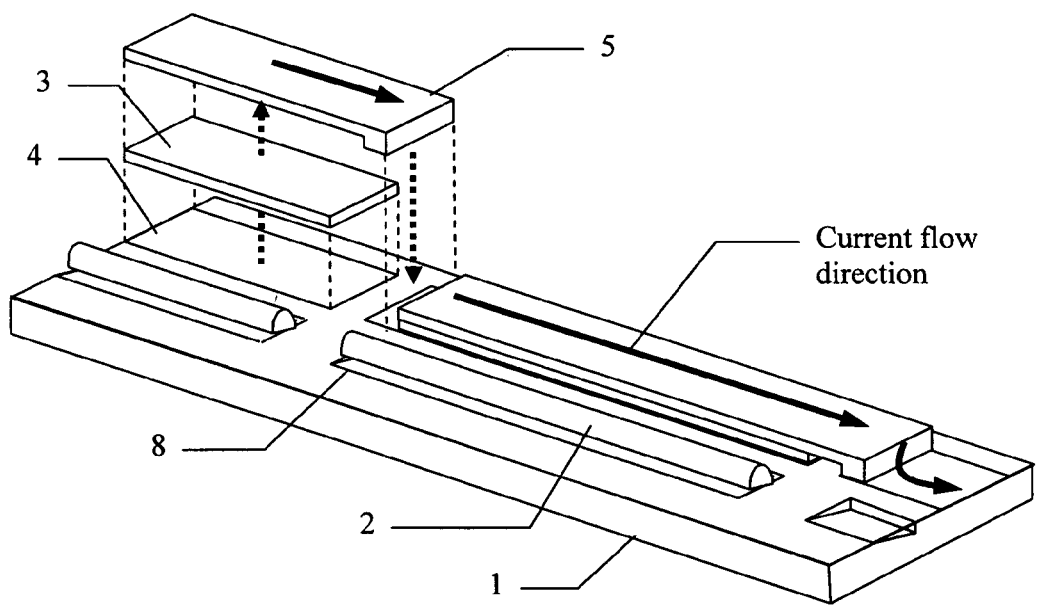
FIG. 25 shows a pair of laser diode bars in a horizontally series connection in accordance with the subject invention.

Laser diode bars are typically connected in series. The subject invention relates to a method of connecting laser diode bars for beam control prism packaging. The subject invention can utilize, for example, a "vertical" or a "horizontal" connection, examples of which are shown in FIG. 24 and FIG. 25, respectively. Vertical stacking can involve electrically connecting, in series, laser diode bars to adjacent laser diode bars which care adjacent in a direction perpendicular to the length of the adjacent laser diode bars. Horizontal stacking can involve electrically connecting, in series, laser diode bars to adjacent laser diode bars which are adjacent in a direction parallel to the length of the laser diode bars. Note, the laser diodes emit light beams in a direction perpendicular to the length of the laser diode bars. In both vertically series connection and horizontally series connection, stacking, rows of series connected laser diode bars can be connected in series, or in parallel, as desired. The vertical connection can be used for middle size to small size arrays. In a specific embodiment, a p-side electrode pattern can be utilized. In this embodiment, additional space can be provided for the p-side electrode pattern to reduce the electric resistance. In another specific embodiment, which can allow a higher packing density, a horizontal connection can be utilized.

An embodiment utilizing horizontal connection can allow diode bars at the same electric connection line to share the same extended beam control prism, instead of each bar having a separate prism. In order to utilize the same prism, the diode bar and prism should be precisely positioned relative to each other, and the prism should have appropriate fabrication tolerances.

A p-side electrode can be deposited on top of the substrate. The p-side electrode can be deposited by a number of techniques, such as vacuum coating, chemical deposition, or direct bonding. The electrode pattern design will influence the packaging density, current flow direction, and beam control prism arrangement. Also, the thickness of electrode will influence the current load and temperature of electrode and diode bar. The p-side electrode can be located close to the coolant, such that current induced waste heat can be removed efficiently. The n-side electrode can be, for example, a piece of copper. The cross section of the n-side electrode can be made larger than the p-side electrode so as to reduce current induced waste heat.

Emitters near the edges of a bar are typically cooler than emitters nearer the middle, due to heat flow into adjacent substrate material even when the cooling is uniform. Typically, the edge emitters have lower temperatures than the others due to the absence of a neighboring heat source and due to heat flow laterally into the substrate. In a specific embodiment, the substrate can be shaped to achieve non-uniform cooling such that emitters near the edge can be cooled less than those in the middle of a bar so that all emitters reach approximately the same operating temperature. The edge of the diodes can be kept warmer by increasing the thermal resistance that heat flowing from them experiences. By shaping the coolant side of the substrate into an ice-cube-tray pattern for spray cooling or grooving the substrate cooling side the edge emitters can be kept warmer. Using this technique can enhance the likelihood of the emitters emitting at the same wavelength, since the emission wavelength is dependent on emitter temperature.

Assembling the subject beam control prism, including aligning the prism with respect to the diode bar, is important. All six degree of freedoms can be considered when putting a beam control prism into position with respect to the laser diode bar. The precision used for positioning the subject beam control prism can be related to the size and design of the subject beam control prism. The smaller the prism is, the higher the precision which can be used. For a typical 1 mm wide beam control prism, the positioning tolerance can be, for example, tens of microns and the angular tolerance can be, for example, about 1 mrad.

Commonly used UV-fixed epoxy for holding micro lenses can be used to fix the subject beam control prism on a substrate. After the position of the beam control prism is confirmed, the epoxy can be fixed, or cured. Piezoelectric transducers and/or electro mechanical devices, such as micro electro mechanical (MEM) devices, can also be attached to the subject beam control prism in an array. These devices can, for example, change length and/or angular position when a voltage is applied. As a result, the output laser spot size and/or beam direction can be adjusted. In a specific embodiment, the subject invention pertains to a laser diode bar array in which the subject beam control prism can be aimed and focused as the user chooses. In a specific embodiment, the aiming and focusing can be accomplished via electro mechanical devices devices and/or piezoelectric transducers. This type of array can be particularly useful for scanning large areas.

Simulation by a commercial ray tracing program (such as ASAP by Breault Research Organization from Tucson, Ariz.) can be used in the design of the optical properties of the subject beam control prism and the optical mechanical specifications for packaging the subject beam control prism, allowing selection of appropriate dimensions for the mechanical design.

Figure 26:
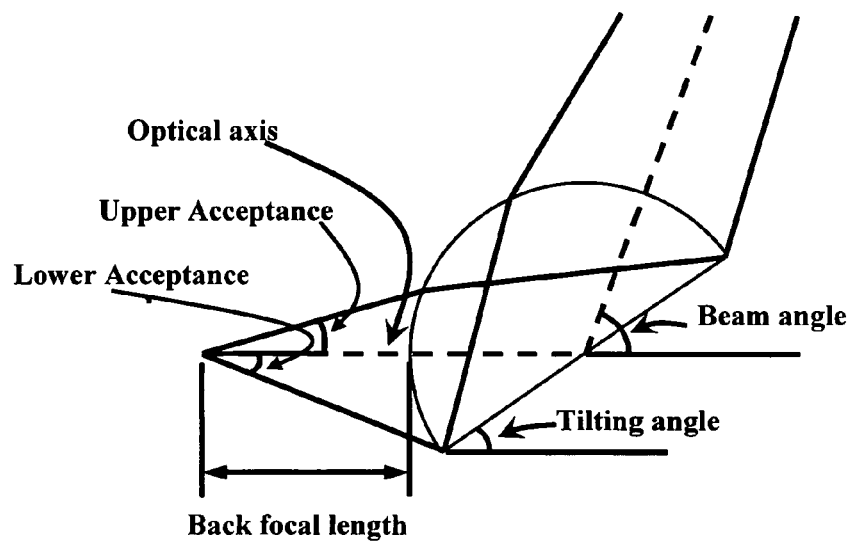
FIG. 26 shows a beam control prism in accordance with the subject invention which can be used for defining parameters.

The acceptance angle of the subject beam control prism is related to its numerical aperture (NA). Since diode lasers typically have a very large divergence angle, the subject beam control prism can have comparably large NA to reduce the power loss. In a specific embodiment, a folded-ball beam control prism design can be used. A discussion of a folded-ball beam control prism will be used as an example to discuss preferred upper and lower acceptance angles for such a beam control prism. FIG. 26 can be referred to for defining parameters.

Figure 27:
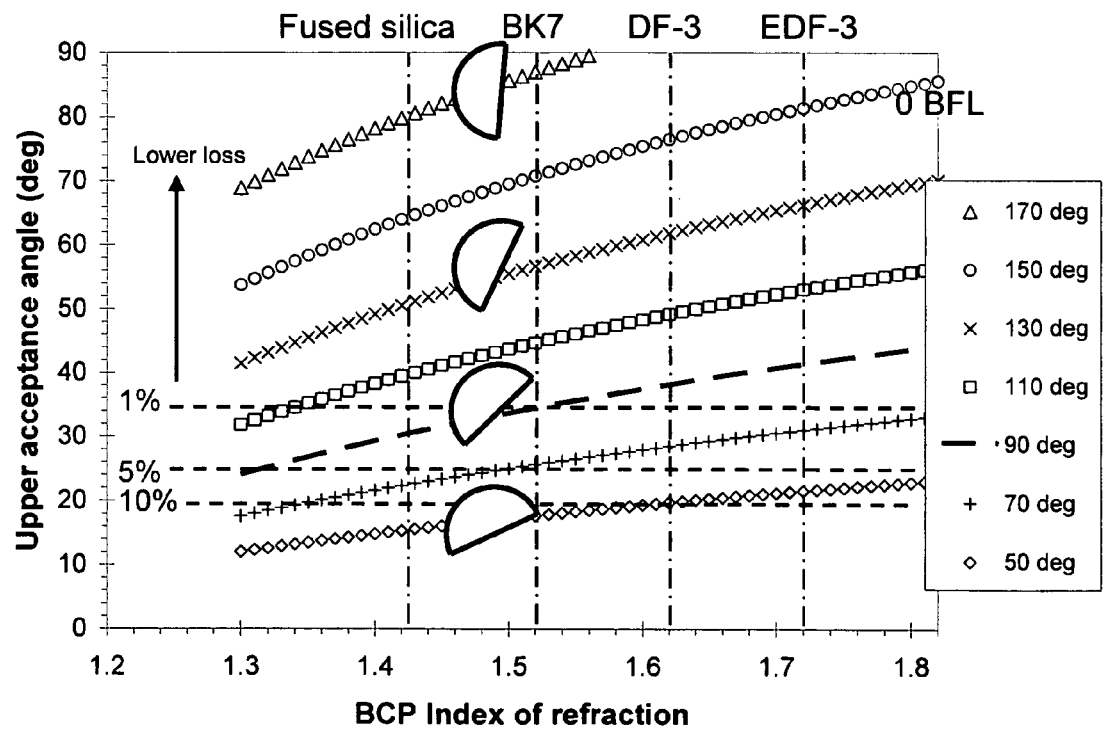
FIG. 27 shows the calculated upper acceptance angle for a folded-ball beam control prism in accordance with the subject invention.

FIG. 27 shows the calculated upper acceptance angle for a folded-ball beam control prism in accordance with the subject invention. From FIG. 27, an estimate of the power loss due to the small acceptance angle can be made. The power losses given assume that the fast axis divergence of the diode lasers is 35° full width at half maximum (FWHM). Higher beam angles will have less power loss. Also, higher index of refraction materials will give a higher acceptance angle, even though the beam angle is the same. This chart can guide the selection of a material with which to make the subject beam control prism, its optimum operating angle range, and any power losses that may be incurred. Similar analysis shows that higher index of refractive materials are preferable for any of the curved surface beam control prisms to achieve lower loss. For a folded ball prism use of a material with an index of refraction less than about 1.8 can be used to avoid the focal length appearing within the prism. A similar limitation can apply to the curved exit surface beam control prism.

Figure 28:
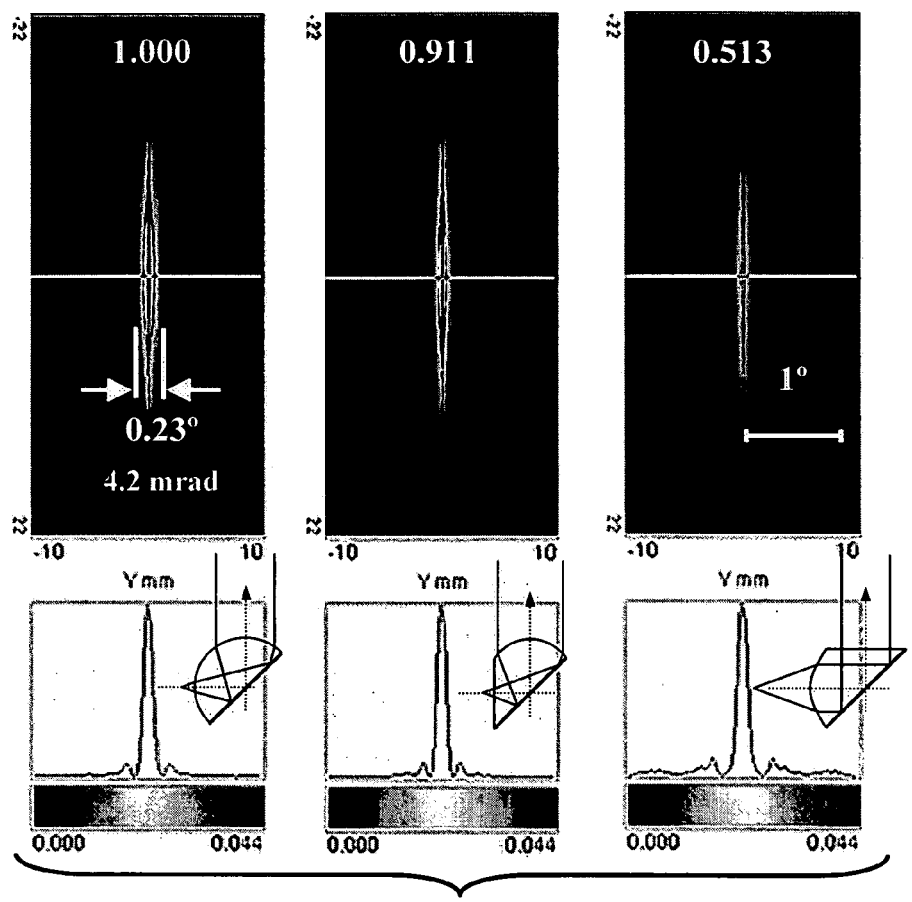
FIG. 28 shows simulation results obtained using an ASAP wave optics simulation.

Since each single emitter is a coherent light source, interference and diffraction can be important. Also, residual aberrations can cause undesirable interference patterns. FIG. 28 is the simulation results obtain using an ASAP wave optics simulation. The radius of the subject beam control prism considered was 0.5 mm and the prism was made from Schott BK7 glass. The diode laser wavelength was 808 nm in this simulation. The results show that all three designs can focus the original laser beam with fast axis divergence of 35° FWHM down to 0.23°. The curved-entrance beam control prism shows the largest spherical aberration; therefore, a broader energy distribution is observed. The numbers on top of the indicated beam distributions indicate the normalized peak power at the detector plane. We see that the curved-entrance beam control prism can only provide half of the peak power of the folded-ball beam control prism in this simulation.

Figure 29:
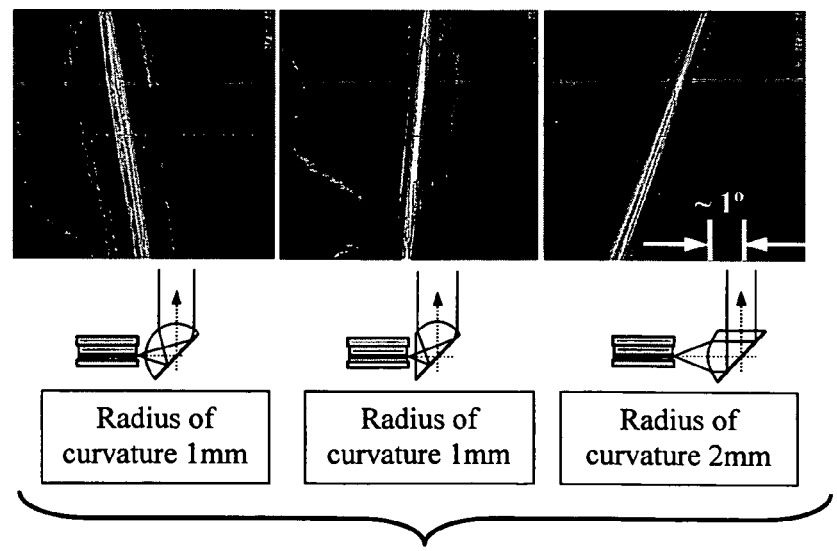
FIG. 29 shows experimental results taken with a change-coupled device camera.
Figure 30:
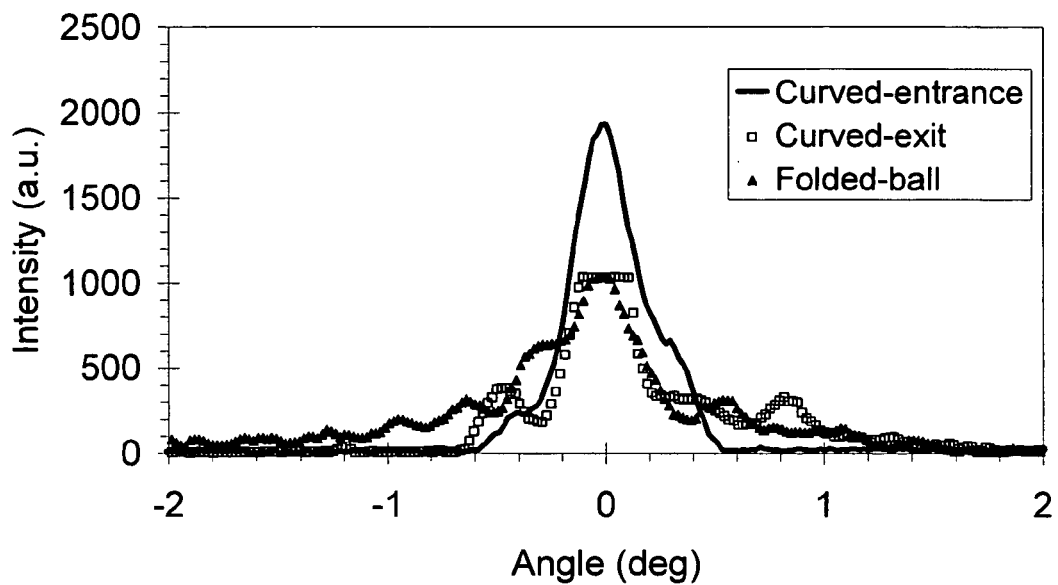

FIG. 29 shows experimental results taken with a charge-coupled device (CCD) camera. FIG. 30 shows the resulting intensity distribution. The results are consistent with the ASAP wave optics simulation result since the measured FWHM of the angular spread of diode laser light through the beam control prisms is less than 0.5° in each case.

A diode laser is typically a very high gain laser device. However, most commonly used high power diode lasers are CW or quasi-CW (QCW) diode bars with more than ten emitters on each bar. Those emitters are independent of each other, producing light that is incoherent with each other. Accordingly, ten or more unrelated beams of light are produced. The resulting beam quality can be poor. Also, it can be hard to control such a light source without specially designed optics. In a specific embodiment of the subject invention, all the emitters can be injection seeded with a single wavelength light source, such that all the independent emitters can be together phase-locked to emit at one wavelength so as to produce an output of coherent light. Under such circumstance, the subject device can provide better beam quality. That is, higher power and lower beam divergence can be achieved. The subject invention can involve use of gratings to feed back the light from each emitter into its neighboring emitters so as to force them into phase locked operation. Light emitted from one emitter can couple into next emitter. These two emitters will be phase locked as long as the feedback is larger than the noise level. Feedback grating can enable locking all the emitters in this manner.

Figure 31A:
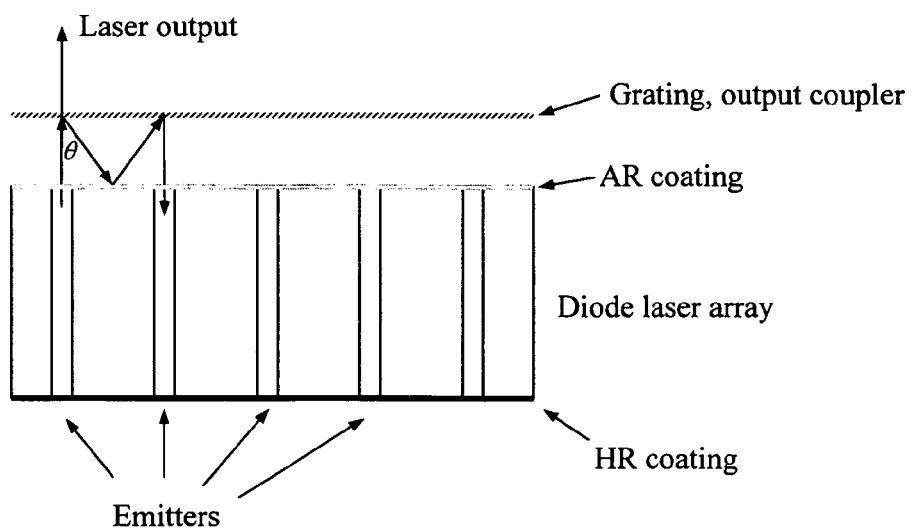
FIG. 31A shows an embodiment of the subject invention incorporating a feedback grating.
Figure 31B:
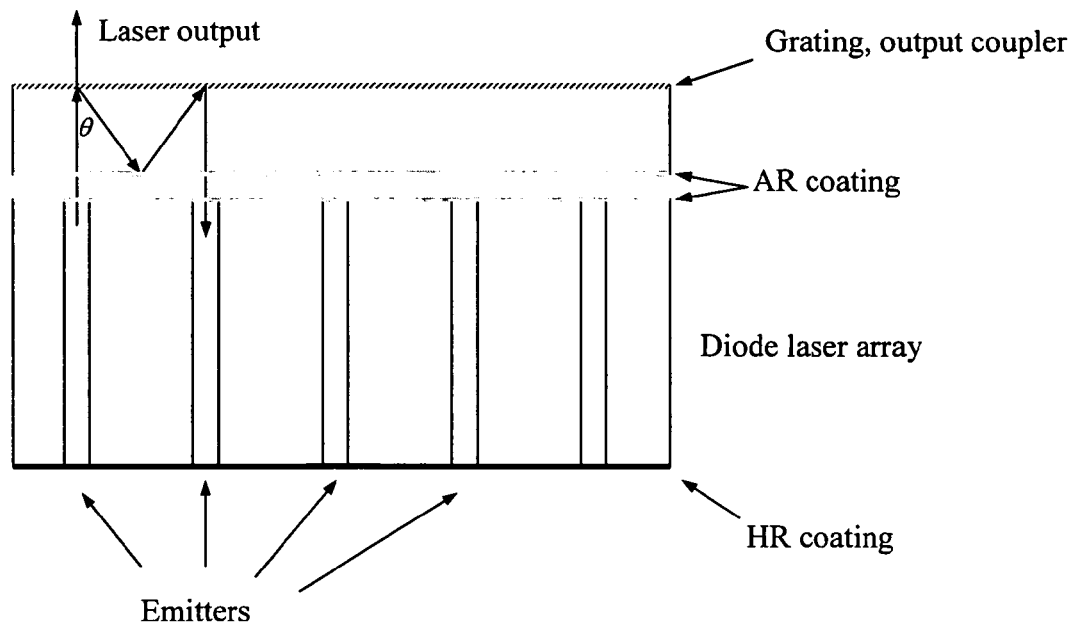
FIG. 31B shows an embodiment of the subject invention incorporating a feedback grating.
Figure 31C:
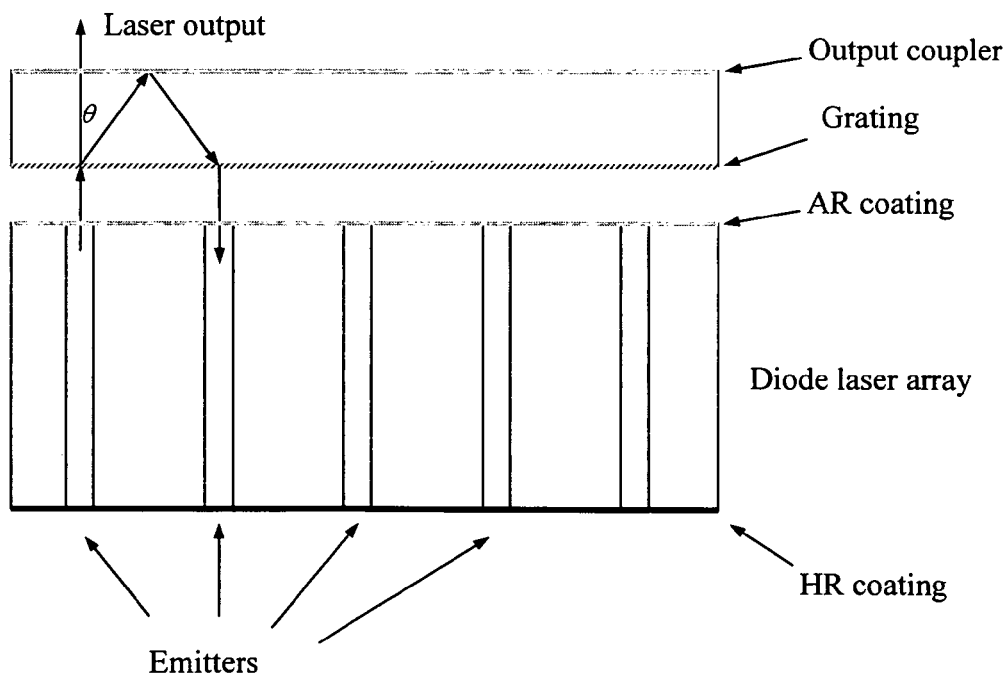
FIG. 31C shows an embodiment of the subject invention incorporating a feedback grating.

A feedback grating which can be utilized in accordance with the subject invention is shown in FIG. 31A. The first order diffracted light will be directed to the midpoint of two adjacent emitters. Then it is reflected to the grating again, such that first order diffracted light will be sent to the second emitter. The optical path is similar to a letter "M". Comparable light re-direction can also be achieved in accordance with the subject invention as shown in FIGS. 31B and 31C, in which a thin slab of glass can be used for propagating the diffracted light. The first order diffracted light will be directed into an angle which is larger than critical angle for total internal reflection. Then total internal reflection will guide the light to interact with grating again. By carefully matching the diode spacing, the feedback grating substrate thickness, the critical angle of the feedback grating substrate, and the grating period the light from one emitter can be redirected into another.

By choosing such grating properties as the blaze angle or the Bragg condition, enhancement of the +1$^{st}$ order diffraction of light can be achieved, while reducing the −1$^{st}$ order. With such a design, the first emitter can be made the dominate oscillator. As long as the feedback is stronger than the noise, the light injected into the next emitter can be the seed from the first oscillator. Consequently, this next emitter will be coherent with the previous emitter. In such manner, the whole array can be coupled into a phase locked array with all the emitters oscillating at the same wavelength. The grating can be combined with micro optics and/or diffractive optics to increase the efficiency. Such a setup is essentially an external cavity design; therefore, many, or all, of the elements inside the cavity can have AR coatings.

Figure 31D:
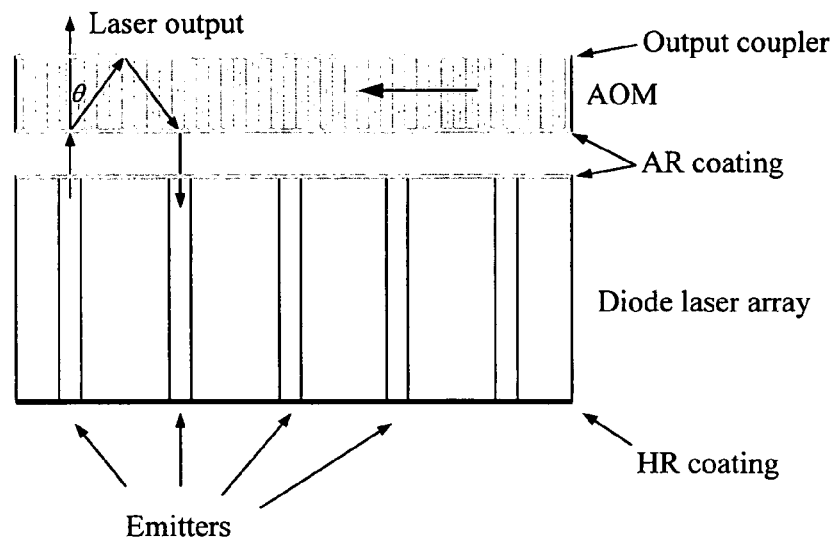
FIG. 31D shows an embodiment of the subject invention incorporating a feedback grating.
Figure 32:
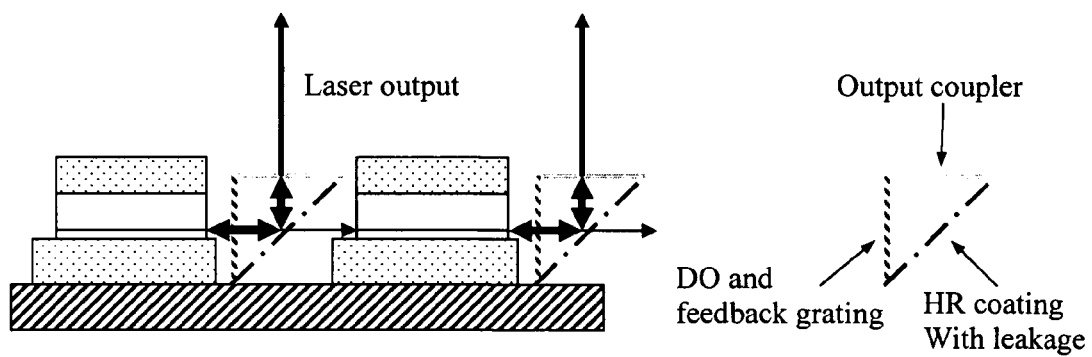
FIG. 32 shows an embodiment of the subject invention incorporating coupling between laser diode bars.

An acousto-optic modulator (AOM) can be used to serve as the grating, as shown in FIG. 31D. Since the diffracted light will pass the grating twice, the frequency will not change. In this embodiment, the driving frequency of the AOM can be dynamically tuned to fine tune the feedback signal. This feedback grating can be combined with the subject beam control prism to redirect the light in a desirable direction. FIG. 32 shows an example of an embodiment utilizing coupling in between bars by using the subject beam control prism. The equivalent feedback grating setup is similar to the embodiment shown in FIGS. 31B and 31C. The grating can also be combined with diffractive optics. The reflective surface of each of the subject beam control prism's can be coated with high reflection (HR) coating, with some leakage, so as to allow a portion of the light from one stage to be injected into the emitters in the next stage. In this case, the back side of the diode laser bars should not use 100% HR coating, but can use a slightly lower reflectivity HR coating. Such use of a slightly lower reflectivity HR coating can allow light to couple into the next stage.

We claim:

1. A laser diode device, comprising:
   a substrate having an upper surface;
   at least one laser diode bar, each laser diode bar comprising at least one laser diode which emits light from a side of the laser diode bar, wherein each laser diode bar is positioned relative to the upper surface of the substrate; and
   a corresponding at least one beam control prism, wherein each beam control prism is positioned with respect to the corresponding laser diode bar such that light from a beam of light emitted from the side of the corresponding laser diode bar enters the beam control prism and exits the beam control prism, wherein the beam control prism alters the direction of at least a portion of the beam of light entering the beam control prism.

2. The laser diode device according to claim 1, wherein the beam control prism is positioned substantially parallel to the upper surface of the substrate.

3. The laser diode device according to claim 1, wherein the beam control prism controls fast axis divergence of the beam of light emitted from the side of the corresponding laser diode bar.

4. The laser diode device according to claim 1, wherein the beam control prism controls slow axis divergence of the beam of light emitted from the side of the corresponding laser diode bar.

5. The laser diode device according to claim 1, wherein the substrate is electrically insulated and thermally conductive.

6. The laser diode device according to claim 1, wherein the substrate is electrically conductive and thermally conductive.

7. The laser diode device according to claim 1, wherein the beam control prism is positioned relative to the corresponding diode laser bar such that at least 50% of the power of the beam of light emitted from the side of the corresponding laser diode bar enters the beam control prism.

8. The laser diode device according to claim 7, wherein the beam control prism is positioned relative to the corresponding diode laser bar such that at least 70% of the power of the beam of light emitted from the side of the corresponding laser diode bar enters the beam control prism.

9. The laser diode device according to claim 7, wherein the beam control prism is positioned relative to the corresponding diode laser bar such that at least 90% of the power of the beam of light emitted from the side of the corresponding laser diode bar enters the beam control prism.

10. The laser diode device according to claim 2, wherein the beam control prism directs the beam of light in a desired direction away from the upper surface of the substrate.

11. The laser diode device according to claim 10, wherein the beam control prism directs the beam of light approximately perpendicular to the upper surface of the substrate.

12. The laser diode device according to claim 1, wherein the at least one laser diode bar is accessible from above the laser diode device.

13. The laser diode device according to claim 1, further comprising:
    a corresponding at least one first electrical conductor, wherein each corresponding first electrical conductor is positioned between the substrate and the corresponding laser diode bar, wherein the corresponding first electrical conductor is a first electrical connection to the corresponding laser diode bar;
    a corresponding at least one second electrical conductor, wherein each corresponding second electrical conductor is positioned on top of the corresponding laser diode bar, wherein the corresponding second electrical conductor is a second electrical connection to the corresponding laser diode bar.

14. The laser diode device according to claim 13, wherein the at least one laser diode bar comprises a plurality of laser diode bars, wherein the plurality of laser diode bars are positioned on the substrate in an array, wherein electrical contact is made with a first electrical conductor of a first laser diode bar in the array, wherein a second electrical conductor of the first laser diode is electrically connected to a first electrical conductor of a second laser diode bar, wherein the second laser diode bar is adjacent to the first laser diode bar in a direction perpendicular to the length of the first laser diode bar, wherein electrical contact is made with a second electrical conductor of the second laser diode bar such that the first and second laser diode bar are connected in series.

15. The laser diode device according to claim 13, wherein the at least one laser diode bar comprises a plurality of laser diode bars, wherein the plurality of laser diode bars are positioned on the substrate in an array, wherein electrical contact is made with a first electrical conductor of a first laser diode bar in the array, wherein a second electrical conductor of the first laser diode is electrically connected to a first electrical conductor of a second laser diode bar, wherein the second laser diode bar is adjacent to the first laser diode bar in a direction parallel to the length of the first laser diode bar, wherein electrical contact is made with a second electrical conductor of the second laser diode bar such that the first and second laser diode bar are connected in series.

16. The laser diode device according to claim 15,
wherein the beam control prism corresponding to the first laser diode bar and the beam control prism corresponding to the second laser diode bar are a single beam control prism which is positioned parallel to the length of the first laser diode bar and parallel to the second laser diode bar so as to receive light emitted from the side of the first laser diode bar and to receive light emitted from the side of the second laser diode bar.

17. The laser diode device according to claim 5,
wherein the substrate comprises a material selected from the group consisting of: BeO, diamond, and AlN.

18. The laser diode device according to claim 6, comprising a layer of electrically insulating material on the upper surface of the substrate.

19. The laser diode device according to claim 1,
wherein the corresponding at least one beam control prism comprises:
an entrance surface, wherein the beam of light emitted from the side of the diode laser bar enters the beam control prism trough the entrance surface;
a reflecting surface, wherein the beam of light which enters the beam control prism is reflected by the reflecting surface; and
an exit surface, wherein the beam of light which enters the beam control prism is reflected by the reflecting surface exits the beam control prism through the exit surface;
wherein the corresponding at least one beam control prism comprises a means for controlling fast and/or slow axis divergence.

20. The laser diode device according to claim 1,
wherein the corresponding at least one beam control prism comprises:
a flat entrance surface, wherein the beam of light emitted from the side of the diode laser bar enters the beam control prism through the flat entrance surface,
a curved reflecting surface, wherein the beam of light which enters the beam control prism is reflected by the curved reflecting surface; and
a flat exit surface, wherein the beam of light which enters the beam control prism is reflected by the flat reflecting surface exits the beam control prism through the flat exit surface.

21. The laser diode device according to claim 20,
wherein the curved reflecting surface reflects the beam of light emitted from the side of the corresponding diode laser bar which enters the beam control prism and controls fast axis divergence of the beam of light.

22. The laser diode device according to claim 20,
wherein the curved reflecting surface is coated with a coating selected from the group consisting of: a dielectric coating and a metallic high reflectivity coating.

23. The laser diode device according to claim 1,
wherein the corresponding at least one beam control prism comprises:
a flat entrance surface, wherein the beam of light emitted from the side of the diode laser bar enters the beam control prism through the flat entrance surface
a flat reflecting surface, wherein the beam of light which enters the beam control prism is reflected by the flat reflecting surface; and
a curved exit surface wherein the beam of light which enters the beam control prism is reflected by the flat reflecting surface exits the beam control prism through the curved exit surface.

24. The laser diode device according to claim 23,
wherein the flat reflecting surface is at an angle of between about 30° and about 60° with respect to the flat entrance surface.

25. The laser diode according to claim 23, wherein the flat reflecting surface is at an angle of about 45° with respect to the entrance surface.

26. The laser diode device according to claim 23,
wherein the curved exit surface controls fast axis divergence of the beam of light emitted from the side of the corresponding diode laser bar which enters the beam control prism.

27. The laser diode device according to claim 23,
wherein the flat reflecting surface is coated with a coating selected from the group consisting of a dielectric coating and a metallic high reflectivity coating.

28. The laser diode device according to claim 1,
wherein the corresponding at least one beam control prism comprises:
a curved entrance surface, wherein the beam of light emitted from the side of the diode laser bar enters the beam control prism through the curved entrance surface
a flat reflecting surface, wherein the beam of light which enters the beam control prism is reflected by the flat reflecting surface; and
a flat exit surface wherein the beam of light which enters the beam control prism is reflected by the flat reflecting surface exits the beam control prism through the curved exit surface.

29. The laser diode device according to claim 28,
wherein the flat reflecting surface is a at an angle of between about 30° and 60° with respect to the entrance surface.

30. The laser diode device according to claim 29, wherein the flat reflecting surface is at an angle of about 45° with respect to the flat entrance surface.

31. The laser diode device according to claim 28,
wherein the curved entrance surface controls fast axis divergence of the beam of light emitted from the side of the corresponding diode laser bar which enters the beam control prism.

32. The laser diode device according to claim 28,
wherein the flat reflecting surface is coated with a coating selected from the group consisting of a dielectric coating and a metallic high reflectivity coating.

33. The laser diode device according to claim 1,
wherein the corresponding at least one beam control prism comprises:
a curved entrance surface, wherein the beam of light emitted from the side of the diode laser bar enters the beam control prism through the curved entrance surface;
a flat reflecting surface wherein the beam of light which enters the beam control prism is reflected by the flat reflecting surface; and
a curved exit surface wherein the beam of light which enters the beam control prism is reflected by the flat reflecting surface exits the beam control prism through the curved exit surface.

34. The laser diode device according to claim 33,
wherein the curved entrance surface and the curved exit surface control fast axis divergence of the beam of light emitted from the side of the corresponding diode laser bar which enters the beam control prism.

35. The laser diode device according to claim 33,
wherein the flat reflecting surface is coated with a coating selected from the group consisting of a dielectric coating and a metallic high reflectivity coating.

36. The laser diode device according to claim 12,
wherein each of the at least one laser diode bar is positioned such that the bottom of each laser diode bar is at or above the upper surface of the substrate.

37. The laser diode device according to claim 12,
wherein each of the at least one laser diode bar is positioned such that the bottom of each laser diode bar is below the upper surface of the substrate.

38. The laser diode device according to claim 12,
wherein each beam control prism is positioned such that at least a portion of the beam control prism is below the upper surface of the substrate.

39. The laser diode device according to claim 1,
wherein the beam control prism controls the divergence of the beam of light.

40. The laser diode device according to claim 1,
wherein the beam control prism comprises with micro-lenses, wherein the micro-lenses control slow axis divergence of the beam of light emitted from the side of the corresponding diode laser bar which enters the beam control prism.

41. The laser diode device according to claim 40, wherein the beam control prism is a folded-ball beam control prism.

42. The laser diode device according to 19, wherein the entrance surface is flat, the reflective surface is flat, and the exit surface is flat, wherein the beam control prism comprises diffractive optics, wherein the diffractive optics controls fast and/or slow axis divergence of the beam of light emitted from the side of the corresponding diode laser bar which enters the beam control prism.

43. The laser diode device according to claim 1,
wherein the beam control prism incorporates diffractive optics, wherein the diffractive optics controls fast and/or slow axis divergence of the beam of light emitted from the side of the corresponding diode laser bar which enters the beam control prism.

44. The laser diode device according to claim 43, wherein the beam control prism comprises a flat entrance, surface, wherein the beam of light emitted from the side of the beam control prism enters the beam control prism through the flat entrance surface,
wherein diffractive optics on the entrance surface of the beam control prism function as a curved entrance surface to control fast and/or slow axis divergence.

45. The laser diode device according to claim 43, wherein the beam control prism comprises an entrance surface, an exit surface, and a flat reflecting surface
wherein the beam of light emitted from the side of the laser diode bar enters the beam control prism through the entrance surface and exits the beam control prism through the exit surface, wherein the reflecting surface comprises diffractive optics, wherein the diffractive optics control slow axis divergence.

46. The laser diode device according to claim 1, further comprising:
a means for moving the beam control prism to adjust the distance between the side of the diode laser bar which emits the beam of light and an entrance surface of the beam control surface through which the beam of light enters the beam control prism.

47. The laser diode device according to claim 46, further comprising:
a means for rotating the beam control prism about an axis parallel with the side of the diode laser bar from which the beam of light is emitted.

48. The laser diode device according to claim 46,
wherein moving the beam control prism alters one or more of the characteristics of the beam of light exiting the beam control prism selected from the group consisting of, focus, spot size, and direction.

49. The laser diode device according to claim 46,
wherein the means for moving the beam control prism comprises a device selected from the group consisting of: piezoelectric transducer and an electro mechanical device.

50. The laser diode device according to claim 1, further comprising:
a means for moving the beam control prism to adjust position of the beam control prism with respect to the upper surface of the substrate.

51. The laser diode device according to claim 1, further comprising:
a means for moving the beam control prism to adjust position of the beam control prism with respect to the upper surface of the substrate.

52. The laser diode device according to claim 1, further comprising:
a means for rotating the beam control prism about an axis parallel with the side of the diode laser bar from which the beam of light is emitted.

53. The laser diode device according to claim 52, wherein the means for rotating the beam control prism is configured such that rotation of the beam control prism alters one or more of the characteristics of the beam of light exiting the beam control prism selected from the group consisting of; focus, spot size, and direction.

54. The laser diode device according to claim 52,
wherein the means for rotating the beam control prism comprises a device selected from the group consisting of: a piezoelectric transducer and a micro-electro mechanical device.

55. The laser diode device according to claim 1,
wherein the corresponding at least one beam control prism comprises:
a curved entrance surface, wherein the beam of light emitted from the side of the diode laser bar enters the beam control prism through the curved entrance surface; and
a flat exit surface, wherein the beam of light which enters the beam control prism exits the beam control prism through the flat exit surface,
wherein the beam of light which enters the beam control prism is refracted at the flat exit surface upon exiting the beam control prism through the flat exit surface.

56. The laser diode device according to claim 55,
wherein the flat exit surface is coated with an anti-reflection coating.

57. The laser diode device according to claim 1,
wherein the beam control prism comprises:
a gradient index of refraction GRIN cylindrical lens, wherein the beam of light emitted from the side of the laser diode bar enters the GRIN cylindrical lens and is collimated; and
a prism, wherein the beam of light exits the GRIN cylindrical lens and enters a flat entrance surface of the prism, is reflected by a reflecting surface of the prism, and exits through an exit surface of the prism such that the beam is redirected by the prism.

58. The laser diode device according to claim 57, wherein the prism is between approximately a 30°-90°-60° prism and approximately 60°-90°-30° prism.

59. The laser diode device according to claim 57, wherein the prism is approximately a 45°-90°-45° prism.

60. The laser diode device according to claim 1, wherein the beam control prism comprises a curved exit surface, wherein the beam of light emitted from the side of the laser diode bar enters the beam control prism and exits the beam control prism through the curved exit surface, wherein the curved exit surface comprises an elliptical curved surface.

61. The laser diode device according to claim 1, wherein the beam control prism comprises a curved entrance surface, wherein the beam of light emitted from the side of the laser diode bar enters the beam control prism through the curved entrance surface, wherein the curved entrance surface comprises a hyperbolic curved surface.

62. The laser diode device according to claim 1, wherein the beam control prism comprises a curved reflecting surface, wherein the beam of light emitted from the side of the laser diode bar enters the beam control prism through an entrance surface and is reflected at the curved reflecting surface, wherein the curved reflecting surface comprises a parabolic curved surface.

63. The laser diode device according to claim 1, wherein the beam control prism is a folded-ball beam control prism.

64. The laser diode device according to claim 1, wherein the folded-ball beam control prism is a gradient index of refraction folded ball lens beam control prism.

65. The laser diode device according to claim 1, wherein the substrate is shaped to achieve non-uniform cooling such that laser diodes near an end of each laser diode bar are cooled less than laser diodes not near an end of the laser diode bar such that all the laser diodes within each laser diode bar reach approximately the same operating temperature.

66. The laser diode device according to claim 1, wherein the beam control prism is fixed to the substrate via UV-fixed epoxy.

67. The laser diode device according to claim 1, wherein the laser diodes are injection seeded with a light source of a first wavelength.

68. The laser diode device according to claim 67, wherein the laser diodes are phase-locked to emit at the first wavelength.

69. The laser diode device according to claim 1, further comprising:
a feed back grating, wherein the feed back grating feeds back light emitted from a first laser diode of a first laser diode bar of the at least one laser diode bar to a second laser diode of the first laser diode bar such that the first laser diode and the second laser diode are phase-locked.

70. The laser diode device according to claim 69, wherein the first laser diode bar comprises n laser diodes, wherein the feed back grating feeds back light emitted by $m^{th}$ laser diode, where 1<m<n, to the $(m+1)_{th}$ laser diode such that the n laser diodes are phase locked.

71. The laser diode device according to claim 69, wherein first order diffracted light emitted from the first laser diode diffracted by the feed back grating is directed to the side of the laser diode bar from which the beam of light is emitted at a midpoint between the first laser diode and the second laser diode, reflected from the side of the laser diode bar, and diffracted by the feed back grating into the second laser diode.

72. The laser diode device according to claim 69, wherein the laser diode spacing, feedback grating, substrate thickness, critical angle of feedback grating, and grating period are such that the Bragg condition is achieved.

73. The laser diode device according to claim 69, wherein the first laser diode is a dominant oscillator.

74. The laser diode device according to claim 69, wherein the feed back grating comprises an acousto-optic modulator.

75. The laser diode device according to claim 69, wherein the first laser diode and the second laser diode are in a first row of laser diodes, wherein the light beam emitted by the first laser diode enters the corresponding beam control prism and is reflected by a reflecting surface of the beam control prism, wherein a portion of the beam of light passes through the reflecting surface of the beam control prism and enters a first laser diode of a second row of laser diode so as to seed the first laser diode of the second row of laser diodes with light, wherein the first laser diode of the first row and the first laser diode of the second row are phase locked.

76. The laser diode device according to claim 1, wherein the beam control prism incorporates a hologram within the beam control prism, wherein the hologram controls fast and/or slow axis divergence of the beam of light emitted from the side of the corresponding laser diode bar which enters the beam control prism.

* * * * *

UNITED STATES PATENT AND TRADEMARK OFFICE
CERTIFICATE OF CORRECTION

PATENT NO.    : 6,975,465 B1
DATED         : December 13, 2005
INVENTOR(S)   : Te-Yuan Chung et al.

It is certified that error appears in the above-identified patent and that said Letters Patent is hereby corrected as shown below:

Column 1,
Line 21, "generates tremendous amount of waste heat" should read -- generates tremendous amounts of waste heat --.

Column 3,
Lines 54-55, "vertically series" should read -- vertical series --.
Lines 56-57, "horizontally series" should read -- horizontal series --.

Column 4,
Line 37, "shown in Figure A" should read -- shown in FIG 1A --.

Column 8,
Lines 65-66, "In alternative embodiment prism" should read -- In an alternative embodiment, a prism --.

Column 9,
Lines 4-5 "have large spherical aberration." should read -- have a large spherical aberration. --.
Line 24, "FIGS. 22A-22C shows" should read -- FIGS. 22A-22C show --.
Line 27, "incorporate micro Fresnel lens" should read -- incorporate a micro Fresnel lens --.

Column 12,
Lines 52-53, "can couple into next emitter" should read -- can couple into the next emitter --.

Column 15,
Line 29, "control prism trough the entrance" should read -- control prism through the entrance --.

Column 16,
Lines 38-39, "is a at an angle of" should read -- is at an angle of --.

Column 17,
Line 26, "comprises with micro-lenses" should read -- comprises micro-lenses, --.
Line 33, "according to 19," should read -- according to claim 19, --.
Line 47, "comprises a flat entrance, surface," should read -- comprises a flat entrance surface, --.

UNITED STATES PATENT AND TRADEMARK OFFICE
CERTIFICATE OF CORRECTION

PATENT NO. : 6,975,465 B1
DATED : December 13, 2005
INVENTOR(S) : Te-Yuan Chung et al.

It is certified that error appears in the above-identified patent and that said Letters Patent is hereby corrected as shown below:

Column 18,
Lines 11-12, "consisting of, focus, spot size, and direction." should read -- consisting of: focus, spot size and direction. --.

Column 20,
Line 14, "to the $(m + 1)_{th}$ laser" should read -- to the $(m + 1)^{th}$ laser --.

Signed and Sealed this

Eighteenth Day of April, 2006

JON W. DUDAS
*Director of the United States Patent and Trademark Office*